(12) United States Patent
Oh et al.

(10) Patent No.: US 9,230,981 B2
(45) Date of Patent: Jan. 5, 2016

(54) SEMICONDUCTOR DEVICE

(71) Applicant: SK hynix Inc., Gyeonggi-do (KR)

(72) Inventors: Sung Lae Oh, Chungcheongbuk-do (KR); Go Hyun Lee, Gyeonggi-do (KR); Chang Man Son, Gyeonggi-do (KR); Soo Nam Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/448,832

(22) Filed: Jul. 31, 2014

(65) Prior Publication Data

US 2015/0243673 A1    Aug. 27, 2015

(30) Foreign Application Priority Data

Feb. 21, 2014    (KR) .................. 10-2014-0020708

(51) Int. Cl.
| | | |
|---|---|---|
| *G11C 16/04* | (2006.01) | |
| *H01L 27/115* | (2006.01) | |
| *H01L 29/792* | (2006.01) | |
| *G11C 5/06* | (2006.01) | |
| *G11C 16/08* | (2006.01) | |
| *G11C 16/24* | (2006.01) | |

(52) U.S. Cl.
CPC .......... *H01L 27/11582* (2013.01); *G11C 5/063* (2013.01); *G11C 16/0466* (2013.01); *G11C 16/08* (2013.01); *G11C 16/24* (2013.01); *H01L 27/11573* (2013.01); *H01L 29/7926* (2013.01)

(58) Field of Classification Search
CPC ............... G11C 16/0483; G11C 16/12; H01L 27/11565; H01L 27/1157; H01L 27/11573; H01L 29/7926; H01L 27/11578; H01L 27/1158
See application file for complete search history.

(56) References Cited

U.S. PATENT DOCUMENTS

| | | |
|---|---|---|
| 8,493,800 B2 | 7/2013 | Terada et al. |
| 2013/0130468 A1 | 5/2013 | Higashitani et al. |
| 2013/0228739 A1* | 9/2013 | Sasago et al. ............... 257/4 |

FOREIGN PATENT DOCUMENTS

JP    2013-161803    8/2013

* cited by examiner

*Primary Examiner* — Roy Potter
*Assistant Examiner* — Paul Patton
(74) *Attorney, Agent, or Firm* — IP & T Group LLP

(57) ABSTRACT

Provided are a semiconductor device. The semiconductor device includes a memory block including a drain select line, word lines, and a source select line, which are spaced apart from one another and stacked in a direction perpendicular to a semiconductor substrate; and a peripheral circuit including a switching device connected to a bit line, which is disposed under a vertical channel layer vertically passing through the drain select line, the word lines, and the source select line.

14 Claims, 5 Drawing Sheets

SEMICONDUCTOR DEVICE

CROSS-REFERENCE TO RELATED APPLICATION

The present application claims priority to Korean patent application number 10-2014-0020708, filed on Feb. 21, 2014, the entire disclosure of which is incorporated herein in its entirety by reference.

BACKGROUND

1. Field of Invention

Various exemplary embodiments of the present invention relate to a semiconductor device, and more particularly, to a 3-dimensional (3D) semiconductor memory device.

2. Description of Related Art

A 3D semiconductor memory device is proposed as a way to overcome the integration limit of 2D semiconductor memory devices.

Cell strings of a 2D semiconductor memory device are planarly arranged on a semiconductor substrate, and cell strings of a 3D semiconductor memory device are vertically arranged on a semiconductor substrate. As the size of memory cells in the 2D semiconductor memory device shrink, interference and disturbance increase, and it is difficult to perform operations such as a multi-level cell (MLC) operation in a 2-dimensional semiconductor memory device. On the contrary, in 3-dimensional semiconductor memory devices, the area of the semiconductor substrate can be efficiently used because it incorporates a stacked structure perpendicular to the semiconductor substrate. Therefore, it is easier to improve the integration degree in 3D semiconductor memory devices than in 2D semiconductor memory devices, and recently, various technologies for increasing integration have been proposed.

SUMMARY

The present invention is directed to a 3D semiconductor memory device with improved integration degree and a manufacturing method thereof.

One aspect of the present invention provides a semiconductor device including: a memory block including a drain select line, word lines, and a source select line, which are spaced apart from one another and stacked in a direction perpendicular to a semiconductor substrate; and a peripheral circuit including a switching device connected to a bit line, which is disposed under a vertical channel layer vertically passing through the drain select line, the word lines, and the source select line.

Another aspect of the present invention provides a semiconductor device including: a memory block including vertical channel layers, to which a plurality of memory cells are connected, and cell strings, bit lines and source lines which are connected to lower and upper portions of the vertical channel layers, respectively; a peripheral circuit including a plurality of switching devices connected to the bit lines under the cell strings; and a control circuit suitable for controlling the peripheral circuit to perform operations on the memory cells.

Still another aspect of the present invention provides a method of manufacturing a semiconductor device including: forming a switching device over a semiconductor substrate; forming a first contact plug over a drain of the switching device, and forming a second contact plug over a source of the switching device; forming a bit line over the second contact plug; forming cell strings vertically connected with the bit line over the bit line, wherein some of the cell strings are located over a region in which the second contact plug is formed; and forming a source line over the cell strings.

Forming a metal wire to transmit a voltage of the peripheral circuit to the first contact plug may be comprised.

The forming of the cell strings may include sequentially stacking a drain select line, word lines and a source select line on the bit line; and forming a vertical channel layer vertically passing through the source select line, the word lines and the drain select line, and connected to the bit line.

The forming of the vertical channel layer may form the vertical channel layer connected to the source line.

After forming the bit line, forming a third contact plug having the same width as the bit line, or a smaller width than that of the bit line over the bit line; and forming protective pads having greater planar areas than that of the third contact plugs over the third contact plugs may be comprised.

The forming of the first and second contact plugs may form the first and second contact plugs so that heights of the second contact plug and the first contact plug are different from each other.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Hereinafter, exemplary embodiments of the invention will be described with reference to the accompanying drawings. However, the invention is not limited to the embodiments disclosed hereinafter, and the embodiments of the invention can be implemented in various forms.

Figure 1:
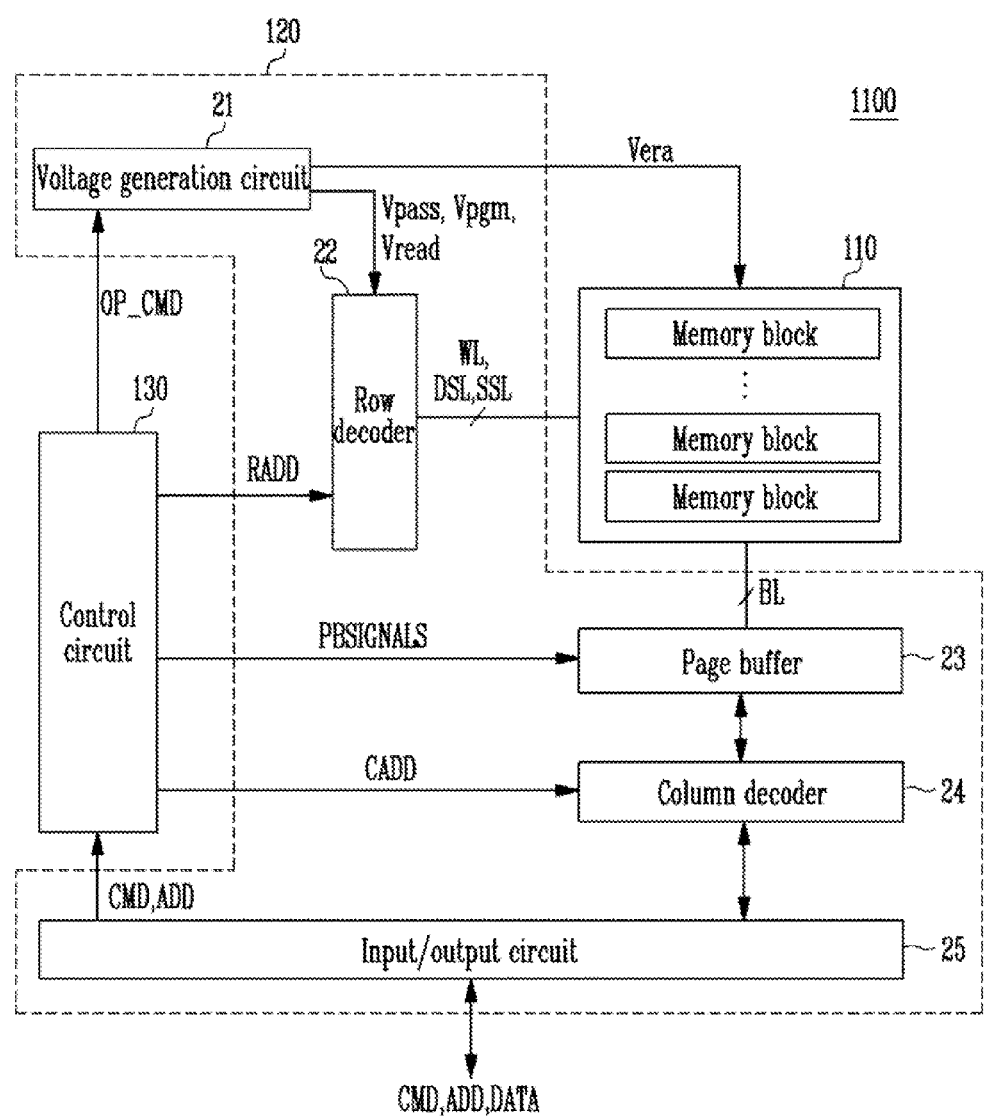
FIG. 1 is a block diagram illustrating a semiconductor device.

FIG. 1 is a block diagram illustrating a semiconductor device.

Referring to FIG. 1, a semiconductor device 1100 may include a memory cell array 110 for storing data, a peripheral circuit 120 for performing operations such as program, read and erase on the memory cell array 110, and a control circuit 130 for controlling the peripheral circuit 120.

The memory cell array 110 may include a plurality of memory blocks. Particularly, the memory blocks may comprise a 3D semiconductor memory device. The 3D memory device may include cell strings arranged perpendicularly to a semiconductor substrate, and a plurality of memory cells spaced apart from each other, and stacked along the cell strings.

The peripheral circuit 120 may include a voltage generation circuit 21, a row decoder 22, a page buffer 23, a column decoder 24, and an input/output circuit 25.

The voltage generation circuit 21 may generate operation voltages of various levels in response to an operation command signal OP_CMD. The operation command signal OP_CMD may include a program command signal, a read command signal, and an erase command signal. For example, the voltage generation circuit 21 may generate an erase voltage Vera, a program voltage Vpgm, a read voltage Vread, and a pass voltage Vpass, and in addition may generate voltages having various other levels. The erase voltage Vera may be transmitted to a selected memory block, and the remaining voltages including the program voltage Vpgm, the read voltage Vread and the pass voltage Vpass may be applied to the row decoder 22.

The row decoder 22 may select one of the memory blocks included in the memory cell array 110 in response to a row address RADD, and transmit the operation voltages to word lines WL, drain select lines DSL, and source select lines SSL which are connected to the selected memory block.

The page buffer 23 may be connected to the memory blocks through the bit lines BL, may send and receive data to and from the selected memory block during the program, read and erase operations, and may temporarily store the received data.

The column decoder 24 may send and receive data to and from the page buffer 23 in response to a column address CADD.

The input/output circuit 25 may transmit a command signal CMD and an address ADD, which are received from the outside (e.g. an external device), to the control circuit 130, may send data DATA, which is received from the outside, to the column decoder 24 and may output the data DATA, which is received from the column decoder 24, to the outside or to the control circuit 130.

The control circuit 130 may control the peripheral circuit 120 in response to the command signal CMD and the address ADD. For example, the control circuit 130 may control the peripheral circuit 120 to perform the program operation, the read operation and the erase operation in response to the command signal CMD and the address ADD.

Figure 2:
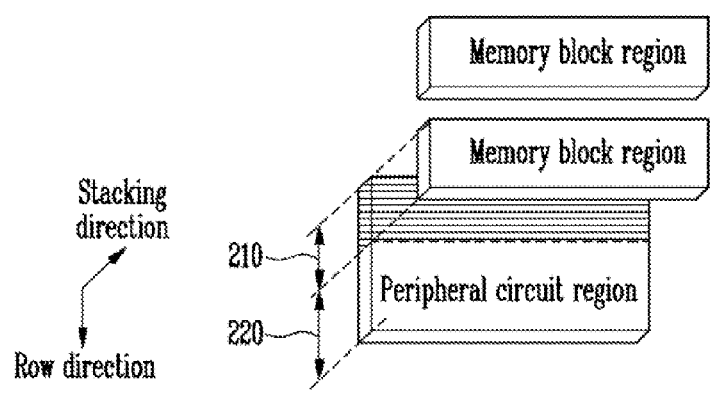
FIG. 2 is a schematic diagram illustrating a memory block region and a peripheral circuit region of a semiconductor device according to an embodiment of the present invention.

FIG. 2 is a schematic diagram illustrating a memory block region and a peripheral circuit region of a semiconductor device according to an embodiment of the present invention.

FIG. 2 shows a peripheral circuit region where the peripheral circuit 120 is disposed, and a memory block region where the memory blocks 110 are disposed. Referring to FIG. 2, the peripheral circuit region and the memory block region may partly overlap. For example, the page buffer 23 included in the peripheral circuit 120 may be disposed under one of the memory blocks 110, and the page buffer 23 and the memory block may partly overlap, as denoted 210 in FIG. 2. As such, in comparison with an area occupied by existing peripheral circuit regions as denoted 210 and 220 in FIG. 2, the size of the semiconductor device may be reduced by the partially overlapping vertically disposed memory block region and peripheral circuit region in the semiconductor device.

A manufacturing method of forming the peripheral circuit region under the memory block region of a 3D semiconductor memory device will be described in detail as follows.

FIGS. 3 to 6 are diagrams illustrating a manufacturing method of a semiconductor memory device according to an embodiment of the present invention.

Figure 3:
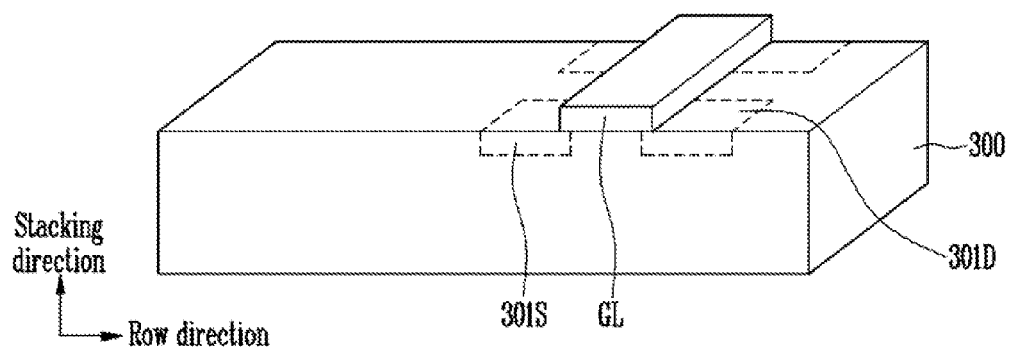
FIGS. 3 to 6 are diagrams illustrating a manufacturing method of a semiconductor memory device according to an embodiment of the present invention.

Referring to FIG. 3, a gate line GL may be formed on a semiconductor substrate 300, and junctions 301S and 301D may be formed in the semiconductor substrate 300 in contact with both ends of the gate line GL. The gate line GL may be formed of a conductive layer, and the junctions 301S and 301D may be formed by injecting or doping impurities into the semiconductor substrate 300. The junctions 301S and 301D may be defined as a source and a drain, respectively. Alternatively, after the junctions 301S and 301D may be formed in the semiconductor substrate 300, the gate line GL may be formed to partially overlap the junctions 301S and 301D on the semiconductor substrate 300 between the junctions 301S and 301D. The gate line GL and the junctions 301S and 301D may serve as switching devices included in the page buffer 23 of the peripheral circuit region.

Figure 4:
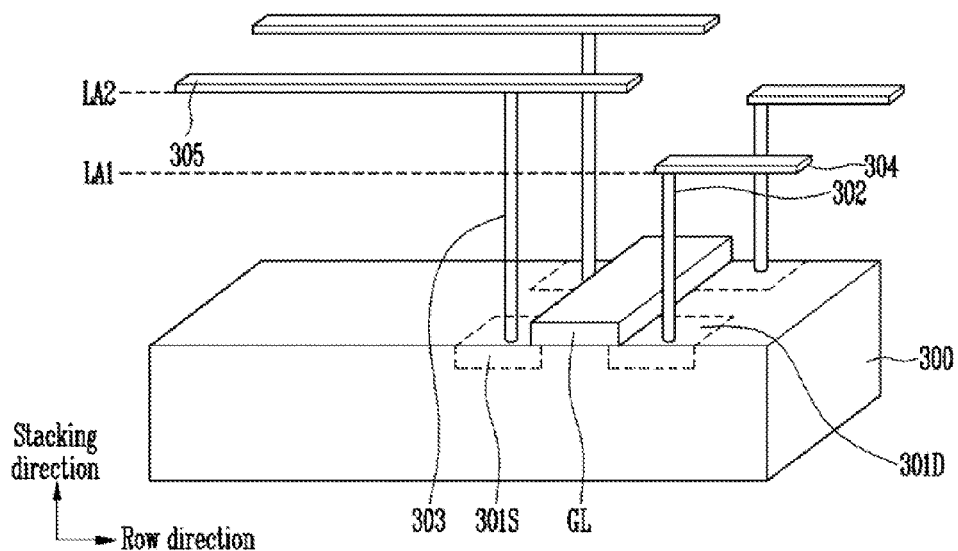

Referring to FIG. 4, a first contact plug 302 may be formed over a drain 301D, and a metal wire 304 may be formed over the first contact plug 302. The metal wire 304 may be connected to a switching device to select a bit line 305 in the page buffer 23, or to a sensing node. A second contact plug 303 may be formed over a source 301S, and the bit line 305 may be formed over the second contact plug 303. When the first contact plug 302 is formed to have a first height LA1, the second contact plug 303 may be formed to have a second height LA2 higher than the first height LA1 in order to prevent the metal wire 304 and the bit line 305 from coming in contact with each other, and to prevent interference between the metal wire 304 and the bit line 305.

Figure 5:
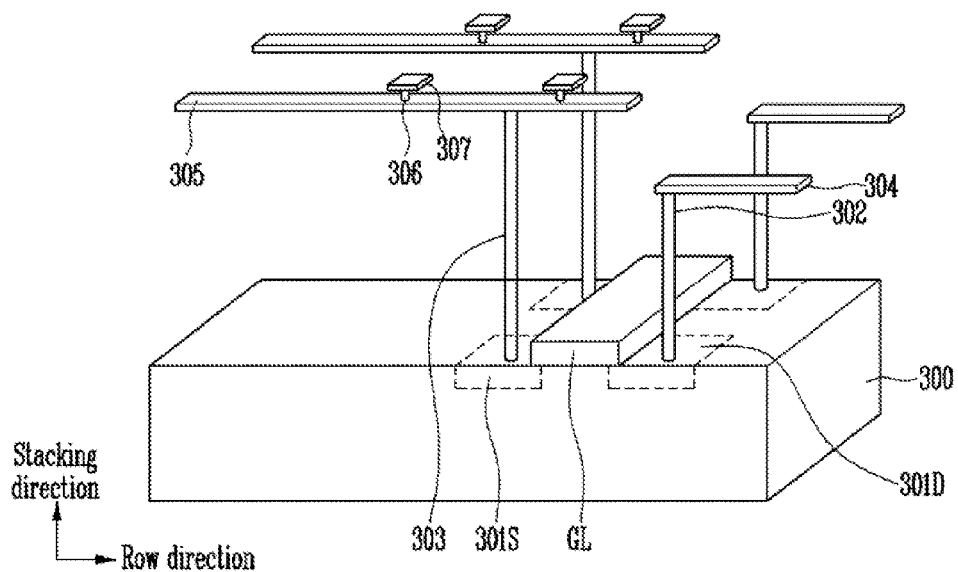

Referring to FIG. 5, a third contact plug 306 may be formed over a bit line 305. As the third contact plug 306 connects a vertical channel layer (to be formed later) and the bit line 305 to each other, the third contact plug 306 may be formed of a conductive layer electrically connected to the bit line 305. Because the width of the bit line 305 may be gradually reduced in order to improve integration of the semiconductor device, the third contact plug 306 in contact with the bit line 305 may be formed to have the same width as the bit line 305 or a smaller width than the bit line 305. Increasing the integration degree of the semiconductor device may place a height limitation on the third contact plug 306. To form the third contact plug 306 having a small width and a small height, during an etching process to form a vertical channel hole, in which the vertical channel layer may be formed later, the third contact plug 306 and the bit line 305 may be exposed. Particularly, when the bit line 305 may be exposed during the etching process, resistance may be increased or yield may be adversely affected due to etching damage to the bit line 305. Further, since the width of the third contact plug 306 is small relative to the width of the bit line 305, there may be a risk of misalignment when the vertical channel layer is formed.

In order to prevent this problem, a protective pad 307 having a greater planar area than the third contact plug 306 may be formed over the third contact plug 306. The protective pad 307 may be formed of a conductive layer so that the vertical channel layer, to be formed later, and the third contact plug 306 can be electrically connected to each other.

Figure 6:
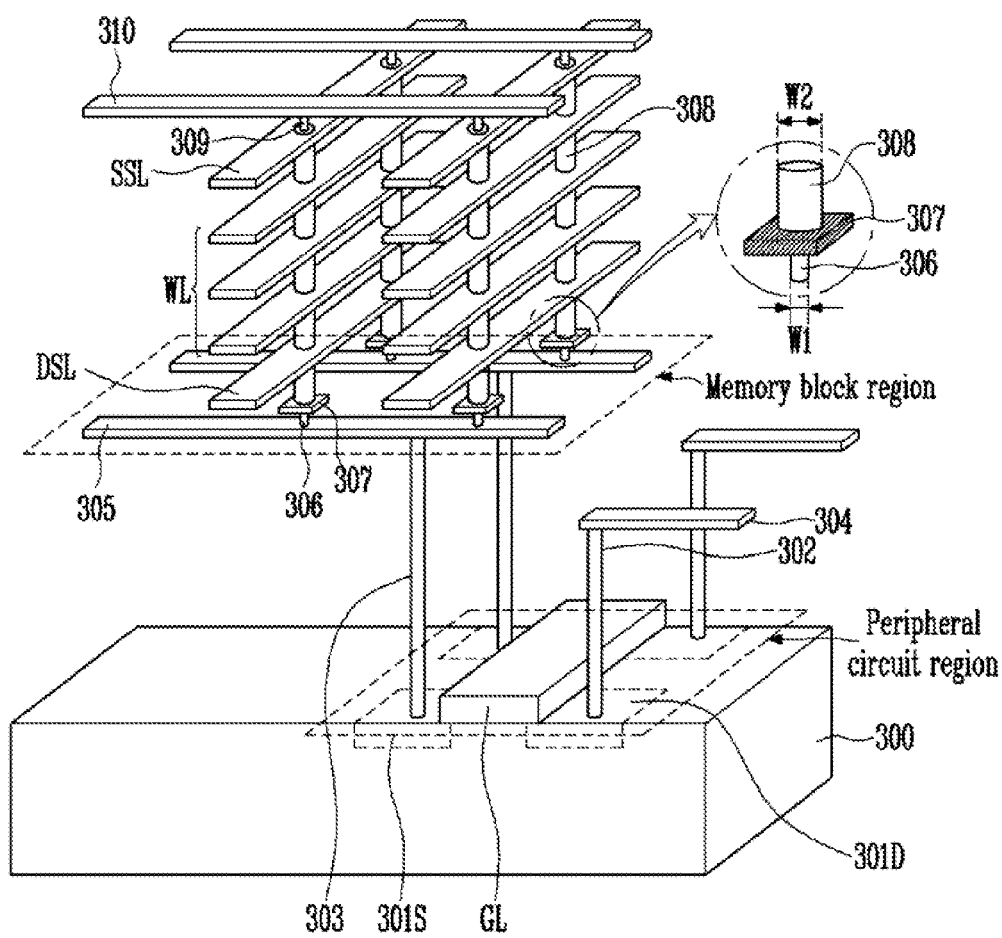

Referring to FIG. 6, a drain select line DSL, a plurality of word lines WL and a source select line SSL, which may be spaced apart from one another and stacked, may be formed over the protective pad 307, and a vertical channel layer 308 vertically passing through the source select line SSL, the word lines WL and the drain select line DSL may be formed. The source select line SSL, the word lines WL and the drain select line DSL may be arranged in parallel to one another, and may be arranged perpendicularly to a plane, in which a bit line 305 may be arranged.

Although not illustrated, an insulating layer may be filled between components illustrated in the drawings. Therefore, before forming the vertical channel layer 308, a plurality of material layers including an insulating layer may be formed over the protective pad 307, and a vertical channel hole may be formed by etching the material layers for the vertical channel layer 308. An etching process for forming the vertical channel hole may be performed until the protective pad 307 is exposed. After forming the vertical channel hole, the vertical channel layer 308 may be formed inside the vertical channel hole. The vertical channel layer 308 may have a width W2 greater than a width W1 of the third contact plug 306. The vertical channel layer 308 may be formed as follows.

Figure 7:
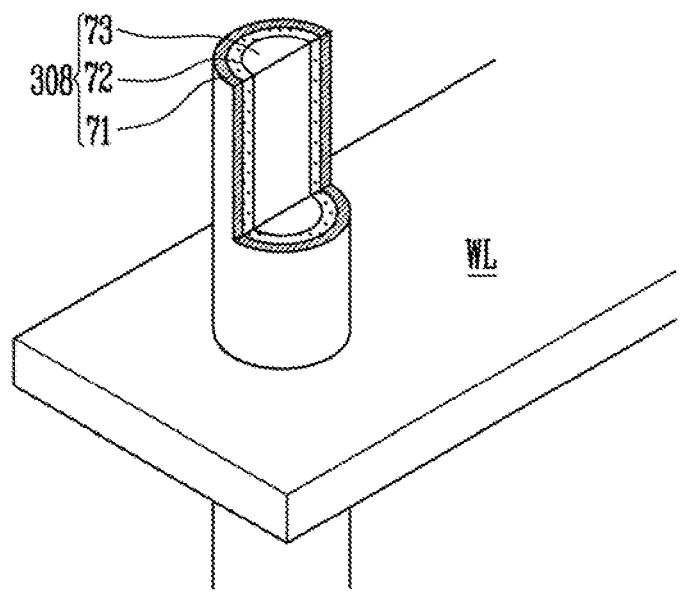
FIG. 7 is a diagram illustrating a vertical channel layer shown in FIG. 6.

FIG. 7 is a diagram illustrating the vertical channel layer shown in FIG. 6.

Referring to FIG. 7, the vertical channel layer 308 may include a vertical pillar 73, a channel layer 72, and a memory stack layer 71. The vertical pillar 73 may be formed of an insulating layer. The channel layer 72 may be formed to cover the vertical pillar 73, and may be formed of poly-silicon. The memory stack layer 71 may be formed to cover the channel layer 72, and may include a tunnel insulating layer and a charge storage layer. The tunnel insulating layer may be formed of an oxide layer, and the charge storage layer may be formed of a nitride layer. The memory stack layer 71 overlapping the word line WL may be defined as a memory cell, the memory stack layer 71 overlapping the drain select line DSL may be defined as a drain select transistor, and the memory stack layer 71 overlapping the source select line SSL may be defined as a source select transistor.

Referring again to FIG. 6, a fourth contact plug 309 may be formed over the vertical channel layer 308. The fourth contact plug 309 may be formed to have a smaller width than the vertical channel layer 308 so that it will not come in contact with the source select line SSL. A portion of the vertical pillar 73 formed over the vertical channel layer 308 may be removed, and be filled with a conductive layer to electrically connect the fourth contact plug 309 and the vertical channel layer 308. For better electrical connection between the vertical channel layer 308 and the protective pad 307, a portion of the vertical pillar 73 in the lower portion of the vertical channel layer 308 may be formed of a conductive layer.

A source line 310 may be formed over the fourth contact plug 309. Thereby, cell strings comprising the drain select transistor, the plurality of memory cells and the source select transistor vertically stacked along the vertical channel layer 308 may be formed. A region of the cell strings becomes the memory block region, and a region, in which the switching devices (the gate line GL, and the junctions 301S and 301D) are formed, becomes the peripheral circuit region.

Particularly, a bit line 305 may be arranged under the cell string, and the source line 310 may be arranged over the cell string. Because of the bit line 305 formed under the cell string, the peripheral circuit region, which may communicate with the bit line 305, may be disposed under the memory block region so that the peripheral circuit region and the memory block region may partly overlap with each other. In the overlapped area, the switching device of the peripheral circuit region and the cell string of the memory block region may be stacked. Therefore, integration degree of the semiconductor device may be improved by the overlapped area between the memory block region and the peripheral circuit region.

Figure 8:
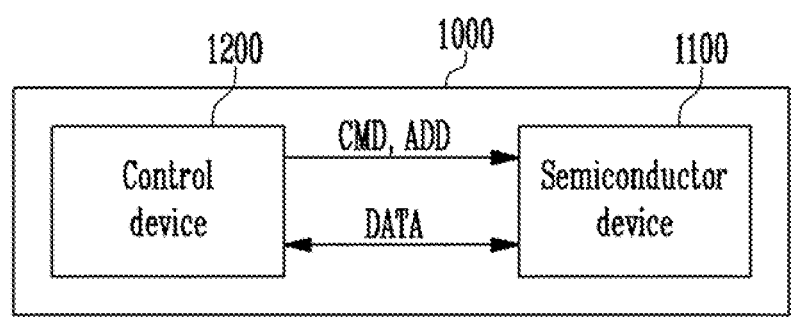
FIG. 8 is a block diagram illustrating a semiconductor system according to an embodiment of the present invention.

FIG. 8 is a block diagram illustrating a semiconductor system according to an embodiment of the present invention.

Referring to FIG. 8, a semiconductor system 1000 may include the above-described semiconductor device 1100, and a control device 1200 configured to control the semiconductor device 1100. For example, the control device 1200 outputs a command signal CMD and an address ADD to the semiconductor device 1100 in response to a command received from the outside. The semiconductor device 1100 performs program, read and erase operations in response to the command signal CMD and the address ADD. Further, the semiconductor device 1100 and the control device 1200 may exchange data DATA with each other. Particularly, as described above, since the memory block region and the peripheral circuit region may partly overlap, the size of the semiconductor device 1100 may be reduced, and thus the overall size of the semiconductor system 1000 may also be reduced.

The technology of the present invention can improve integration degree in semiconductor devices by partially overlapping the peripheral circuit region and the memory block region of the 3D semiconductor memory device.

While the spirit and scope of the invention is described in the exemplary embodiments of the invention, it should be noted that the above-described embodiments are merely descriptive and should not be considered as limiting. Further, it should be understood by those skilled in the art that various changes, substitutions and alterations may be made herein without departing from the scope of the invention as defined by the following claims.

What is claimed is:

1. A semiconductor device, comprising:
   a memory block including a drain select line, word lines, and a source select line, which are spaced apart from one another and stacked in a direction perpendicular to a semiconductor substrate; and
   a peripheral circuit including a switching device connected to a bit line, which is disposed under a vertical channel layer vertically passing through the drain select line, the word lines, and the source select line.

2. The semiconductor device of claim 1, wherein the word lines are disposed over the drain select line, and the source select line is disposed over the word lines.

3. The semiconductor device of claim 1, herein the vertical channel layer includes a vertical pillar, a channel layer covering the vertical pillar, and a memory stack layer covering the channel layer.

4. The semiconductor device of claim 3, wherein the memory stack layer includes a tunnel insulating layer and a charge storage layer.

5. The semiconductor device of claim 1, wherein the switching device includes a gate line, and a source and a drain formed in the semiconductor substrate in contact with both ends of the gate line.

6. The semiconductor device of claim 5, comprising:
   a first contact plug formed over the drain and connected to the peripheral circuit; and
   a second contact plug formed over the source and connected to the bit line.

7. The semiconductor device of claim 6, wherein heights of the second contact plug and the first contact plug are different from each other.

8. The semiconductor device of claim 1, further comprising a third contact plug connected between the bit line and the vertical channel layer, and having a smaller width than that of the vertical channel layer.

9. The semiconductor device of claim 8, further comprising a protective pad connected between the third contact plug and the vertical channel layer, and having a greater planar area than that of the third contact plug.

10. The semiconductor device of claim 1, wherein the memory block further includes a source line disposed over the source select line.

11. The semiconductor device of claim 10, further comprising a fourth contact plug connected between the vertical channel layer and the source line.

12. A semiconductor device, comprising:
    a memory block including vertical channel layers, to which a plurality of memory cells are connected, and cell strings, bit lines and source fines which are connected to lower and upper portions of the vertical channel layers, respectively;

a peripheral circuit including a plurality of switching devices connected to the bit lines under the cell strings; and a control circuit suitable for controlling the peripheral circuit to perform operations on the memory cells.

13. The semiconductor device of claim 12, wherein a memory block region, in which the memory block is disposed, and a peripheral circuit region, in which the peripheral circuit is disposed, are overlapped in a region, in which the switching devices and the bit line are disposed.

14. The semiconductor device of claim 12, wherein the switching devices are disposed under the bit lines so that regions of the memory block and the peripheral circuit are partly overlapped with each other in a direction perpendicular to a semiconductor substrate.

\* \* \* \* \*